(12) United States Patent
Luo

(10) Patent No.: US 6,591,615 B1
(45) Date of Patent: *Jul. 15, 2003

(54) ELECTRICAL APPLIANCE USING THERMAL CONDUCTOR

(76) Inventor: Chin-Kuang Luo, 5F, No. 56, Min-Chuan Rd., Chung Dist., Taichung City (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/201,795

(22) Filed: Jul. 24, 2002

(30) Foreign Application Priority Data

Apr. 24, 2002 (TW) ..................... 91205617 U

(51) Int. Cl.[7] ............................................. F25B 21/02
(52) U.S. Cl. ........................... 62/3.7; 62/457.3; 62/3.3
(58) Field of Search ................... 62/3.2, 3.7, 3.3, 62/457.9, 457.3, 457.4

(56) References Cited

U.S. PATENT DOCUMENTS 2,991,628 A * 7/1961 Tuck ........................ 62/3.62
5,042,258 A * 8/1991 Sundhar ..................... 62/3.2
5,842,353 A * 12/1998 Kuo-Liang ................. 62/190
6,000,224 A * 12/1999 Foye ........................ 62/3.2
6,422,024 B1 * 7/2002 Foye ........................ 62/3.2
6,487,865 B1 * 12/2002 Luo ......................... 62/3.61
2002/0034381 A1 * 3/2002 Luo ......................... 392/480

* cited by examiner

Primary Examiner—William C. Doerrler
(74) Attorney, Agent, or Firm—Trop, Pruner & Hu, P.C.

(57) ABSTRACT

In an electrical appliance, a thermal conductor includes a hollow heat-conducting member that has inner and outer walls confining an enclosed chamber therebetween, and a superconductor disposed in the chamber. A heat-insulating layer is provided on an outer peripheral surface of the outer wall. A temperature control device includes a thermoelectric unit disposed on and in thermal communication with the outer wall of the heat-conducting member. A control unit is connected to the thermoelectric unit and is operable so as to enable the thermoelectric unit to operate in either a heat-absorbing mode, where the thermoelectric unit absorbs heat from the thermal conductor so as to reduce temperature in the heat-conducting member, or a heat-radiating mode, where the thermoelectric unit radiates heat to the thermal conductor. A power source is connected to the temperature control device for supplying electric power thereto.

13 Claims, 7 Drawing Sheets

ELECTRICAL APPLIANCE USING THERMAL CONDUCTOR

CROSS-REFERENCE TO RELATED APPLICATION

This application claims priority of Taiwanese Application No. 091205617, filed on Apr. 24, 2002.

BACKGROUND OF THE INVENTION

1. Field of the Invention

The invention relates to the art of thermal energy conduction, more particularly to an electrical appliance using a thermal conductor.

2. Description of the Related Art

In a co-pending U.S. patent application Ser. No. 09/951, 174, entitled "FLUID CONDUIT WITH ENHANCED THERMAL CONDUCTING ABILITY", filed by the applicant of this application, there is disclosed an apparatus for conducting thermal energy.

The object of the present invention is to provide an electrical appliance using a thermal conductor that permits heat-absorbing and heat-radiating control in a highly efficient manner.

SUMMARY OF THE INVENTION

According to the present invention, an electrical appliance comprises:

a thermal conductor including a hollow heat-conducting member that has inner and outer walls confining an enclosed chamber there between, and a superconductor that is disposed in the chamber, the inner wall having a first inner surface, the outer wall having a second inner surface, an outer peripheral surface and a bottom surface;

a heat-insulating layer provided on the outer peripheral surface of the outer wall; and a temperature control device including
  a thermoelectric unit disposed on and in thermal communication with the bottom surface of the outer wall of the heat-conducting member, the thermoelectric unit being electrically operable so as to operate in at least one of a heat-absorbing mode, where the thermoelectric unit absorbs heat from the thermal conductor so as to reduce temperature in the heat-conducting member, and a heat-radiating mode, where the thermoelectric unit radiates heat to the thermal conductor, and
  a control unit connected to the thermoelectric unit and operable so as to enable the thermoelectric unit to operate in a selected one of the heat-absorbing mode and the heat-radiating mode; and a power source connected to the temperature control device for supplying electric power thereto.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
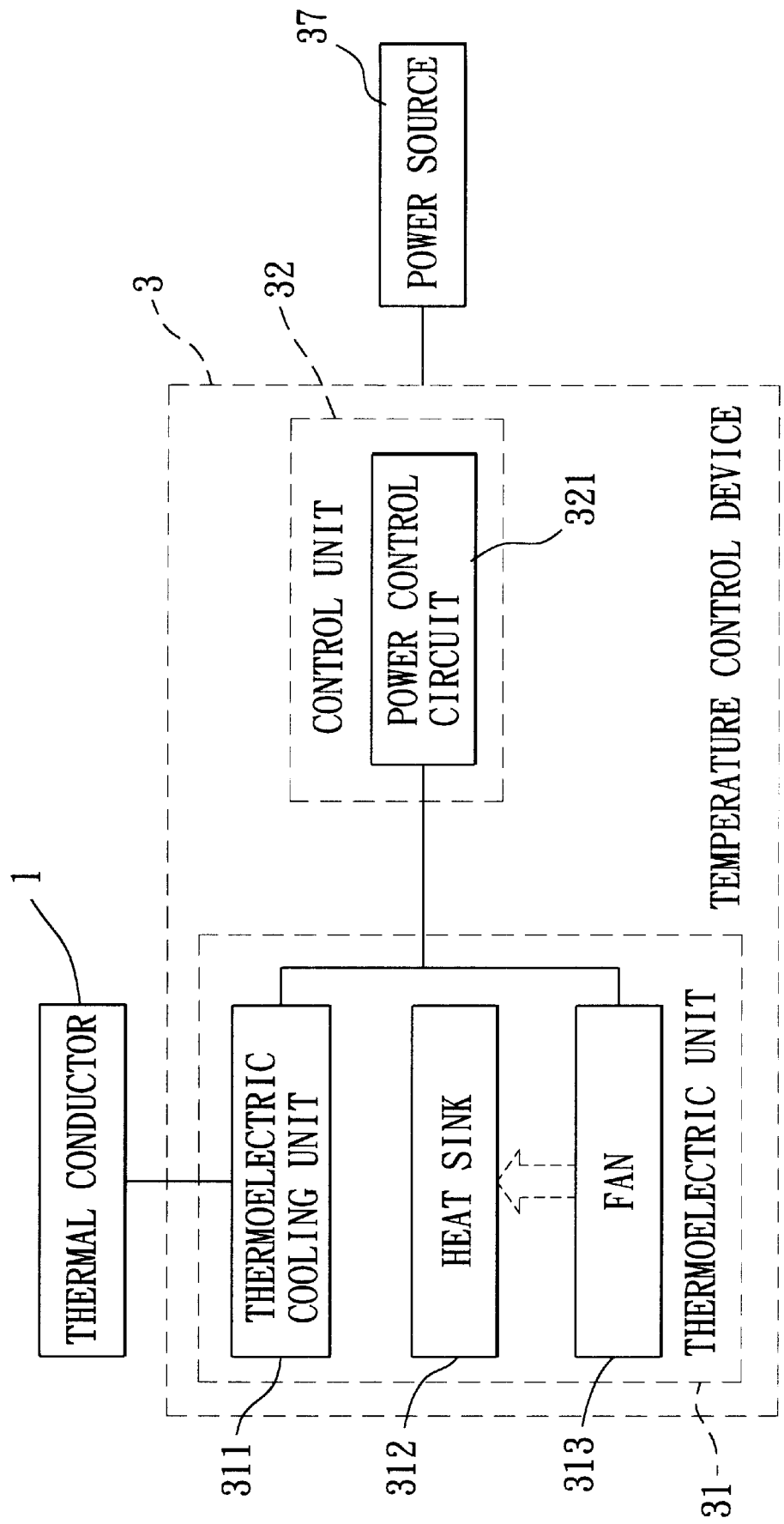
FIG. 1 is a schematic circuit block diagram illustrating the first preferred embodiment of an electrical appliance according to the present invention.

Before the present invention is described in greater detail, it should be noted that like elements are denoted by the same reference numerals throughout the disclosure.

Figure 2:
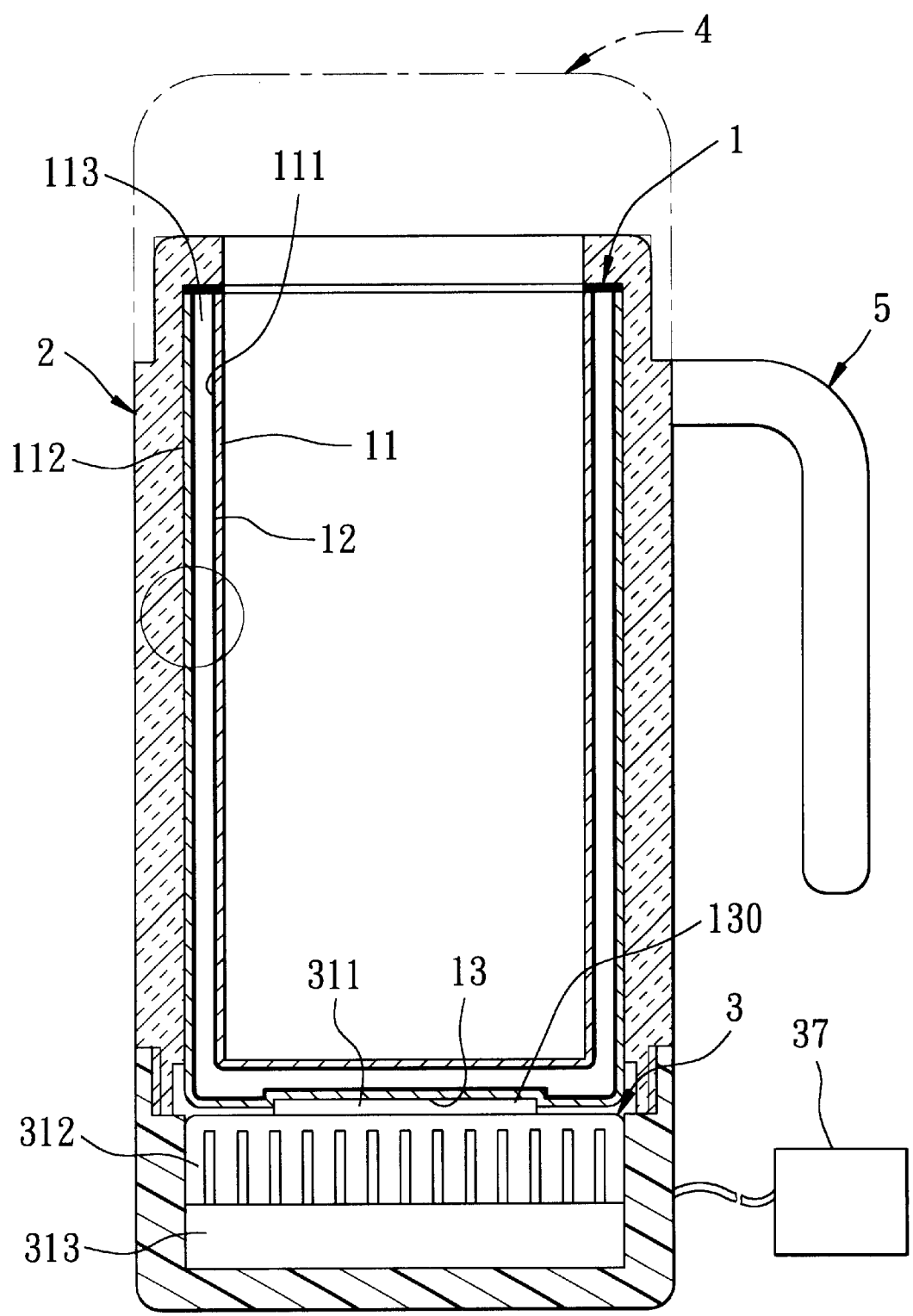
FIG. 2 is a schematic partly sectional view showing the first preferred embodiment.

Referring to FIGS. 1 and 2, the first preferred embodiment of an electrical appliance according to the present invention is shown to include a thermal conductor 1, a heat-insulating layer 2, a temperature control device 3, and a power source 37.

Figure 2A:
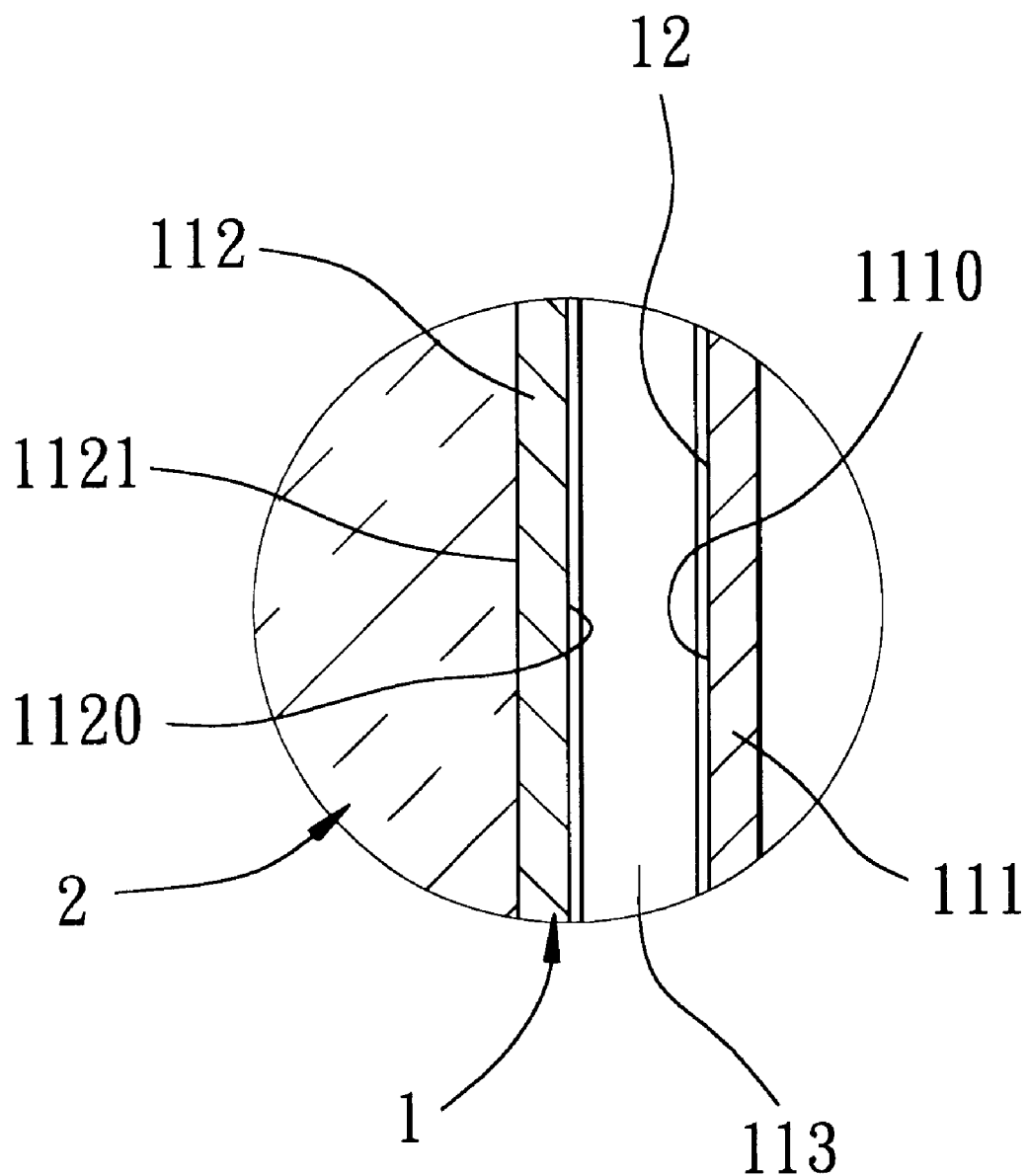
FIG. 2A is a schematic sectional view showing an encircled portion of FIG. 2.

The thermal conductor 1 includes a hollow heat-conducting member 11 that is made of aluminum, copper, a metal alloy or other materials which exhibit excellent heat conducting characteristics, and that has inner and outer walls 111, 112 confining an enclosed chamber 113 therebetween, and a superconductor 12 that is disposed in the chamber 13. In this embodiment, the hollow heat-conducting member 11 is formed as a cup body. The inner wall 111 has a first inner surface 1110 (see FIG. 2A). The outer wall 112 has a second inner surface 1120, an outer peripheral surface 1121 and a bottom surface 13 formed with a recess 130 (see FIGS. 2 and 2A). It is noted that the superconductor 12 includes at least one compound selected from the group consisting of sodium peroxide, sodium oxide, beryllium oxide, manganese sesquioxide, aluminum dichromate, calcium dichromate, boron oxide, dichromate radical, and combinations thereof; at least one compound selected from the group consisting of cobaltous oxide, manganese sesquioxide, beryllium oxide, strontium chromate, strontium carbonate, rhodium oxide, cupric oxide, β-titanium, potassium dichromate, boron oxide, calcium dichromate, manganese dichromate, aluminum dichromate, dichromate radical, and combinations thereof; and at least one compound selected from the group consisting of denatured rhodium oxide, potassium dichromate, denatured radium oxide, sodium dichromate, silver dichromate, monocrystalline silicon, beryllium oxide, strontium chromate, boron oxide, sodium peroxide, β-titanium, a metal dichromate, and combinations thereof. The superconductor 12 forms a lining on each of the first and second inner surfaces 1110, 1120 of the inner and outer walls 111, 112 via known techniques (see FIG. 2).

The heat-insulating layer 2 is provided on the outer peripheral surface 1121 of the outer wall 112.

The temperature control device 3 includes a thermoelectric unit 31 and a control unit 32. The thermoelectric unit 31 is disposed on and is in thermal communication with the bottom surface 13 of the outer wall 112 of the heat-conducting member 11. Thermoelectric unit 31 is electrically operable so as to operate in at least one of a heat-absorbing mode, where the thermoelectric unit 31 absorbs heat from the thermal conductor 1 so as to reduce temperature in the heat-conducting member 11, and a heat-radiating mode, where the thermoelectric unit 31 radiates heat to the thermal conductor 1. The thermoelectric unit 31 includes an electrically operable thermal energy source, such as an electric heating element and a thermoelectric cooling unit, in contact with the bottom surface 13 of the outer wall 112 of the heat-conducting member 11. In this embodiment, the thermal energy source is a thermoelectric cooling unit 311 that has a heat-absorbing side (not shown), and a heat-radiating side (not shown) opposite to the heat-absorbing side. The thermoelectric unit 31 further includes a heat sink 312 disposed on the heat-radiating side, and a fan 313 disposed to induce air currents toward the heat sink 312 (see FIG. 2). The control unit 32 is connected to the thermoelectric unit 31, and is operable so as to enable the thermoelectric unit 31 to operate in a selected one of the heat-absorbing mode and the heat-radiating mode. The control unit 32 includes a power control circuit 321 connected to the thermoelectric cooling unit 311 and the fan 313 of the thermoelectric unit 31 for controlling supply of electric power thereto.

The power source 37 is connected to the temperature control device 3 for supplying electric power thereto. The power source 37 can be an AC source, a battery set or a DC source applied by a car such that the electrical appliance of the present invention can be used in various occasions.

As shown in FIG. 2, the thermal conductor 1 can be mounted threadedly on the temperature control device 3. The electrical appliance further includes a cap 4 covered detachably on the hollow heat-conducting member 11, and a handle 5 mounted on the heat-insulating layer 2. As such, the electrical appliance of the present invention can serve as a portable thermal cup when the power source 37 is in the form of a battery set.

Figure 3:
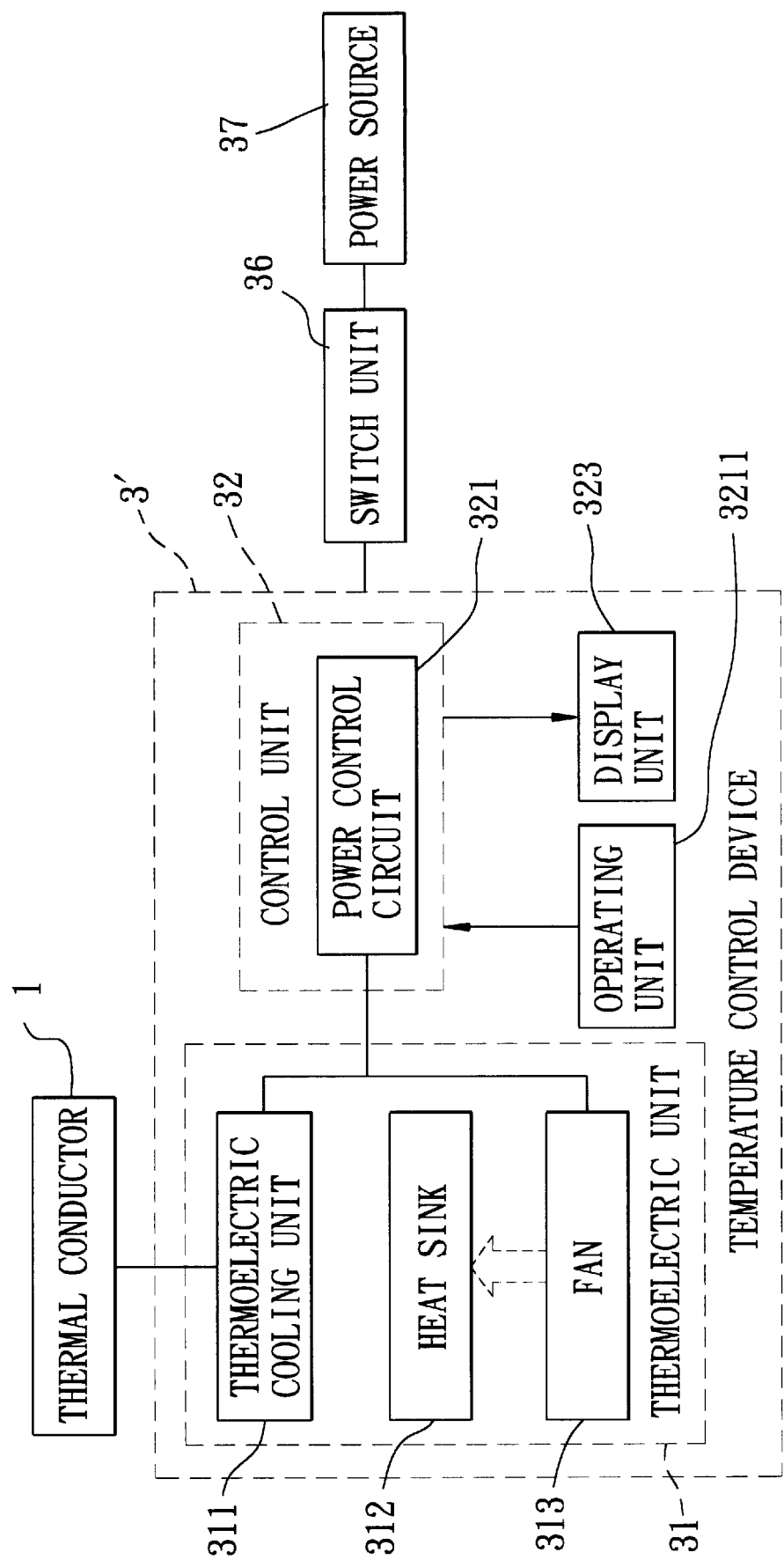
FIG. 3 is a schematic circuit block diagram illustrating the second preferred embodiment of an electrical appliance according to the present invention.
Figure 4:
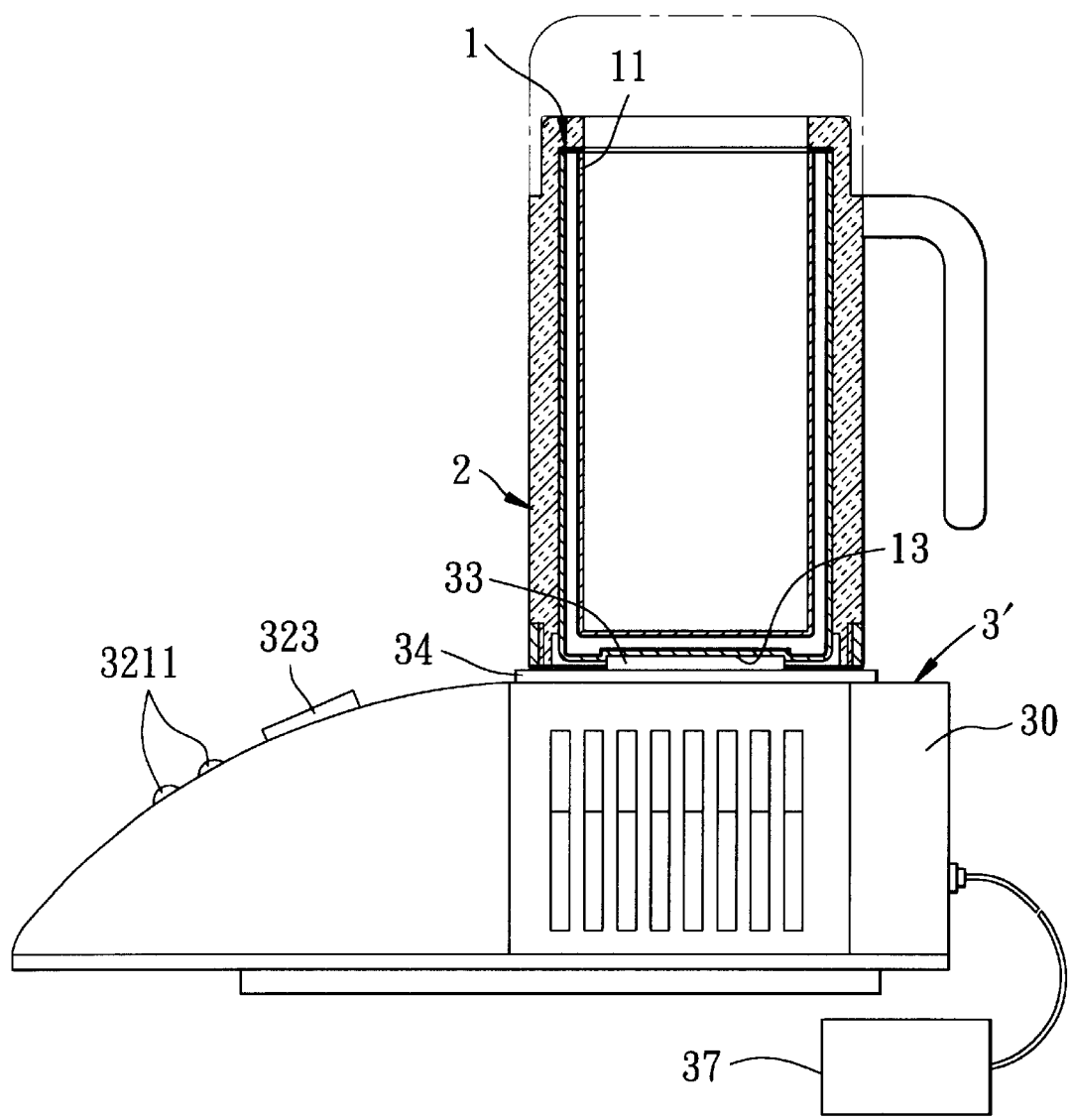
FIG. 4 is a schematic partly sectional, side view showing the second preferred embodiment.

FIGS. 3 and 4 illustrate the second preferred embodiment of an electrical appliance according to the present invention, which is a modification of the first preferred embodiment. Unlike the previous embodiment, the thermal conductor 1 is disposed detachably on the temperature control device 3'. The electrical appliance further includes a switch unit 36 interconnecting the power source 37 and the temperature control device 3'. The switch unit 36 is operable so as to control supply of electric power from the power source to the temperature control device 3'.

Figure 5:
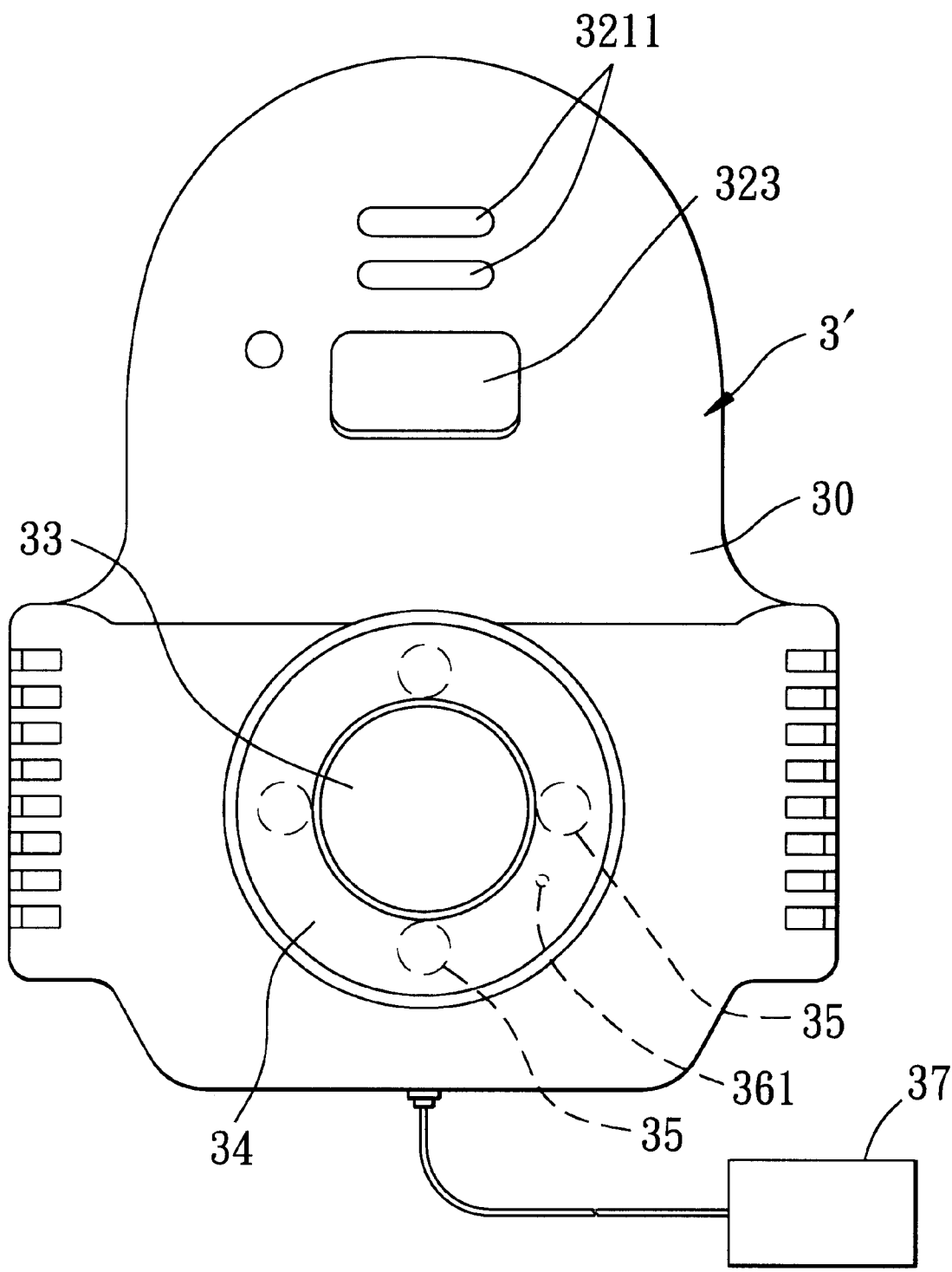
FIG. 5 is a schematic top view showing a temperature control device of the second preferred embodiment.
Figure 6:
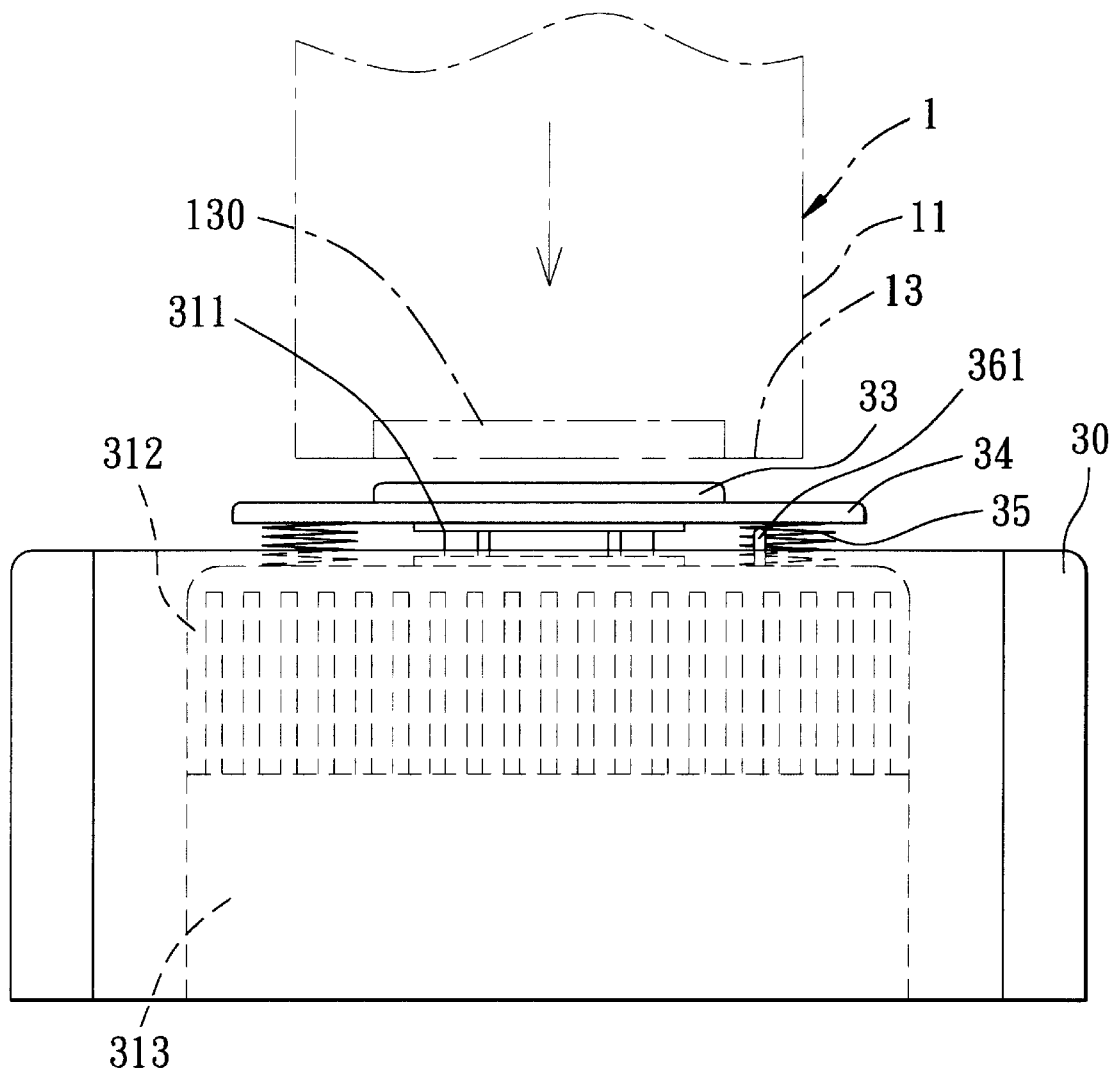
FIG. 6 is a schematic rear view showing the temperature control device when a switch unit thereof is in an OFF-mode.

Referring to FIGS. 5 and 6, the temperature control device 3' further includes a heat-conducting plate 33, an annular pressing plate 34 and a plurality of resilient pieces 35. The heat-conducting plate 33 is, disposed between the bottom surface 13 of the outer wall 112 of the heat-conducting member 11 and the thermoelectric cooling unit 311 such that the heat-conducting member 11 is in thermal communication with the thermoelectric cooling unit 311 via the heat-conducting plate 33. The pressing plate 34 is disposed around the heat-conducting plate 33. The resilient pieces 35 are mounted between the pressing plate 34 and the heat sink 312 of the thermoelectric unit 31 such that the pressing plate 34 is movable relative to the heat sink 312 (see FIG. 6).

In this embodiment, the switch unit 36 includes an operating post 361 disposed between the heat sink 312 and the heat-conducting plate 33 (see FIG. 6). The switch unit 36 is operable so as to switch between an OFF-mode, where the operating post 361 is spaced apart from the pressing plate 34 and where electric power is not supplied to the temperature control device 3' (i.e., the thermal conductor 1 is moved away from the temperature control device 3'), as shown in FIG. 6, and an ON-mode, where the operating post 361 is pressed by the pressing plate 34 when the thermal conductor 1 is disposed on the heat-conducting plate 33 so as to move the pressing plate 34 toward the heat sink 312 and where electric power is supplied to the temperature control device 3'.

With further reference to FIGS. 3 to 5, the temperature control device 3' further includes a display unit 323, in the form of two seven-segment displays, connected to the control unit 32 for displaying temperature information of the thermal conductor 1. The display unit 323 is mounted on a housing 30 of the temperature control device 3'. An operating unit, which includes a plurality of function keys 3211 mounted on the housing 30, is connected to the control unit 32, and is manually operable so as to provide control signals for enabling the control unit 32 to control the power control circuit 35 in order to operate the thermoelectric unit 31 in the selected one of the heat-absorbing mode and the heat-radiating mode.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. An electrical appliance comprising:

a thermal conductor including a hollow heat-conducting member that has inner and outer walls confining an enclosed chamber therebetween, and a superconductor that is disposed in said chamber, said inner wall having a first inner surface, said outer wall having a second inner surface, an outer peripheral surface and a bottom surface;

a heat-insulating layer provided on said outer peripheral surface of said outer wall; and a temperature control device including a thermoelectric unit disposed on and in thermal communication with said bottom surface of said outer wall of said heat-conducting member, said thermoelectric unit being electrically operable so as to operate in at least one of a heat-absorbing mode, where said thermoelectric unit absorbs heat from said thermal conductor so as to reduce temperature in said heat-conducting member, and a heat-radiating mode, where said thermoelectric unit radiates heat to said thermal conductor, and a control unit connected to said thermoelectric unit and operable so as to enable said thermoelectric unit to operate in a selected one of the heat-absorbing mode and the heat-radiating mode; and a power source connected to said temperature control device for supplying electric power thereto.

2. The electrical appliance as claimed in claim 1, wherein said superconductor includes at least one compound selected from the group consisting of sodium peroxide, sodium oxide, beryllium oxide, manganese sesquioxide, aluminum dichromate, calcium dichromate, boron oxide, dichromate radical, and combinations thereof; at least one compound selected from the group consisting of cobaltous oxide, manganese sesquioxide, beryllium oxide, strontium chromate, strontium carbonate, rhodium oxide, cupric oxide, β-titanium, potassium dichromate, boron oxide, calcium dichromate, manganese dichromate, aluminum dichromate, dichromate radical, and combinations thereof; and at least one compound selected from the group consisting of denatured rhodium oxide, potassium dichromate, denatured radium oxide, sodium dichromate, silver dichromate, monocrystalline silicon, beryllium oxide, strontium chromate, boron oxide, sodium peroxide, β-titanium, a metal dichromate, and combinations thereof.

3. The electrical appliance as claimed in claim 1, wherein said superconductor forms a lining on each of said first and second inner surfaces of said inner and outer walls.

4. The electrical appliance as claimed in claim 1, wherein said thermoelectric unit includes an electrically operable thermal energy source in contact with said bottom surface of said outer wall of said heat-conducting member and connected to said control unit, said thermal energy source having at least one of a heat-absorbing side and a heat-radiating side.

5. The electrical appliance as claimed in claim 4, wherein said thermal energy source is a thermoelectric cooling unit.

6. The electrical appliance as claimed in claim 5, wherein said thermoelectric unit further includes a heat sink disposed on said heat-radiating side, and a fan connected to said control unit and disposed to induce air currents toward said heat sink.

7. The electrical appliance as claimed in claim 6, further comprising a switch unit interconnecting said power source and said temperature control device, said switch unit being operable so as to control supply of electric power from said power source to said temperature control device.

8. The electrical appliance as claimed in claim 7, wherein said thermal conductor is disposed detachably on said temperature control device.

9. The electrical appliance as claimed in claim 8, wherein said temperature control device further includes
a heat-conducting plated is posed between said bottom surface of said outer wall of said heat-conducting member and said thermoelectric unit such that said heat-conducting member is in thermal communication with said thermoelectric unit via said heat-conducting plate,
an annular pressing plate disposed around said heat-conducting plate, and
a plurality of resilient pieces mounted between said pressing plate and said heat sink such that said pressing plate is movable relative to said heat sink,
wherein said switch unit includes an operating post disposed between said heat sink and said pressing plate, said switch unit being operable so as to switch between an OFF-mode, where said operating post is spaced apart from said pressing plate and where electric power is not supplied to said temperature control device, and an ON-mode, where said operating post is pressed by said pressing plate when said thermal conductor is disposed on said heat-conducting plate so as to move said pressing plate toward said heat sink and where electric power is supplied to said temperature control device.

10. The electrical appliance as claimed in claim 4, wherein said thermal energy source includes an electric heating element.

11. The electrical appliance as claimed in claim 1, wherein said control unit includes a power control circuit connected to said thermoelectric unit for controlling supply of electric power thereto.

12. The electrical appliance as claimed in claim 1, wherein said temperature control device further includes a display unit connected to said control unit for displaying temperature information of said thermal conductor.

13. The electrical appliance as claimed in claim 1, wherein said hollow heat-conducting member of said thermal conductor is formed as a cup body.

* * * * *